(12) United States Patent
Tsai et al.

(10) Patent No.: US 11,500,012 B2
(45) Date of Patent: Nov. 15, 2022

(54) SEMICONDUCTOR COMPONENT BURN-IN TEST MODULE AND BURN-IN TEST EQUIPMENT

(71) Applicant: King Yuan Electronics Co., Ltd., Hsinchu (TW)

(72) Inventors: Chia-Hung Tsai, Hsinchu (TW); Kuo-Jung Wu, Hsinchu (TW); Hsing-Yueh Liang, Hsinchu (TW); Po-Wei Liao, Hsinchu (TW); Yi-Ting Wang, Hsinchu (TW)

(73) Assignee: KING YUAN ELECTRONICS CO., LTD., Hsinchu (TW)

( * ) Notice: Subject to any disclaimer, the term of this patent is extended or adjusted under 35 U.S.C. 154(b) by 0 days.

(21) Appl. No.: 17/078,126

(22) Filed: Oct. 23, 2020

(65) Prior Publication Data
US 2022/0043052 A1 Feb. 10, 2022

(30) Foreign Application Priority Data
Aug. 10, 2020 (TW) ................................. 109127014

(51) Int. Cl.
*G01R 31/28* (2006.01)
(52) U.S. Cl.
CPC ..... *G01R 31/2863* (2013.01); *G01R 31/2856* (2013.01)
(58) Field of Classification Search
CPC ............................ G01R 31/2863; G01R 31/28
USPC ....................................................... 324/750.3
See application file for complete search history.

(56) References Cited

U.S. PATENT DOCUMENTS

| 5,751,151 | A  | * | 5/1998 | Levy | G01R 31/2851 324/537 |
| 6,815,966 | B1 | * | 11/2004 | Gunn | G01R 31/2863 324/750.05 |
| 2007/0291464 | A1 | * | 12/2007 | Wang | H05K 9/0028 361/820 |

(Continued)

FOREIGN PATENT DOCUMENTS

| JP | 2012117881 A | 6/2012 |
| TW | 201241453 A | 10/2012 |

*Primary Examiner* — Jermele M Hollington
*Assistant Examiner* — Courtney G McDonnough
(74) *Attorney, Agent, or Firm* — Bacon & Thomas, PLLC

(57) ABSTRACT

A semiconductor component burn-in test module includes a burn-in board and an external power transmission component. The burn-in board includes a plurality of burn-in seats, wherein a plurality of chips are disposed on the burn-in seats. The external power transmission component is arranged at opposite two sides of the burn-in board, where the external power transmission component includes a plurality of conductive members and a plurality of terminal seats. The burn-in board is provided with a plurality of wirings corresponding to the external power transmission component. As such, electric power can be conveyed to the plural burn-in seats of the burn-in board, through the plural terminal seats and the plural conductive strips. This decreases the length and the number of copper foil wirings in the burn-in boards for power transmission, so as to lower the cost of the burn-in boards. Also disclosed is a semiconductor component burn-in test equipment using at least one semiconductor component burn-in test module.

13 Claims, 9 Drawing Sheets

(56) References Cited

U.S. PATENT DOCUMENTS

2009/0033348 A1* 2/2009 Kimoto .............. G01R 1/07307
324/756.03
2009/0302876 A1* 12/2009 Koizumi ............ G01R 31/2863
324/756.07

* cited by examiner

SEMICONDUCTOR COMPONENT BURN-IN TEST MODULE AND BURN-IN TEST EQUIPMENT

BACKGROUND OF THE INVENTION

1. Field of the Invention

The present invention relates to a semiconductor component burn-in test module and a burn-in test equipment using at least one burn-in test module, and more particularly, to a semiconductor component burn-in test module and burn-in test equipment adapted for performing semiconductor components burn-in test.

2. Description of Related Art

Currently electronic components or chip packages available in the market, such as integrated circuits, which are normally appeared as miniaturized components for example chips, and which are mounted in the electric circuits formed with major electric circuit components, constitute consecutive and complete electric circuits. To ensure reliability of integrated circuit modules in use, various tests are made to the chips mounted in the integrated circuit modules prior to the mounting. Namely, the chips that have been made are required to proceed with acceptance tests, so as to check whether or not the chips can work normally. This will ensure reliability and yield rate of the chips, so as to screen out and eliminate defective chips.

Burn-in tests are performed to make chips working in severe conditions of high temperature and high pressure, so as to result in an early failure for chips of poor quality. Taking an example, suppose one of the chips is defective in the manufacture of multi-layer metal wires, namely easy to be broken, and as a result, this chip fails only one month after having been sold to a customer. In case such event takes place very often, the company will suffer damage for business reputation, and return of goods makes a great monetary loss to the company. This makes it necessary that before the products leaving the factory, the products have to be subject to a severe condition of high temperature and high pressure, in the hope that the defective products will fail earlier and will be screened out.

Conventionally, since high-performance chips, such as an SOC chip (system on chip) integrating multiple chips of different functions into one single chip, a field programmable gate array (FPGA) chip capable of high-speed arithmetic and control ability, or a 5G base station communication chip consumes a great deal of power, a power supply has to provide high-power electricity when burn-in tests on multiple chips are performed at the same time. However, it is unlikely for such high-power electricity to be transmitted through a printed circuit board (PCB), and as such, a very thick cable for the transmission is necessary. This makes the tests quite difficult.

Generally speaking, a semiconductor component burn-in test equipment can only provide 2 kw burn-in power, where electric power is transmitted from a driver board to an extension card, and eventually to a burn-in board. Referring to FIG. 1, a schematic view illustrating a conventional semiconductor component burn-in test equipment, comprising a burn-in board 90, an interface card 86, an a driver module 80. The driver module 80 is electrically connected with the burn-in board 90 through the interface card 86, and that the driver module 80 includes a power supply 85. The power supply 85 provides electric power which is transmitted, through multiple printed circuit boards on the driver module 80, to the interface card 86, and then to the burn-in board 90. Namely, the high-power electricity required for electric circuit signal transmission and burn-in is transmitted to the burn-in board 90 through the multiple printed circuit boards on the driver module 80. As such, the copper foil circuit in the printed circuit board increases its thickness, and so a larger dimension is required for the printed circuit board, let alone cost increases as well.

Therefore, it is understood that to develop a higher power burn-in board needs to consider and emphasize the following:

1. During a high-power burn-in, because electric power transmission requires a high-power transmission through multiple printed circuit boards, the copper foil circuits in the printed circuit boards increase their thicknesses. This increases the number of grout holes and so requires a larger dimension on the printed circuit board, not only increasing cost, but also adversely affecting impedance matching of signals.
2. Connecting each other for the multiple printed circuit boards, if subject to electromagnetic interference at a high electric current, and if subject to a poor contact, the printed circuit boards will tend to be hot, too hot, or even burned, let alone the transmission distance will tend to consume the power.

As such, the conventional semiconductor component burn-in test equipment relates to a burn-in test equipment, in adopting the manner of power transmission through multiple printed circuit boards, is indeed undesirable, and room for improvement exists.

Given the above, with a spirit of aggressive innovation to solve the above-mentioned problem, a "Semiconductor Component Burn-In Test Module and Burn-In Test Equipment" is conceptualized, and with persistent research and experiments, the present invention can be accomplished eventually.

SUMMARY OF THE INVENTION

An object of the present invention is to provide a semiconductor component burn-in test module and burn-in test equipment, featured in decreasing the length and the number of copper foil wirings in a burn-in board for power transmission, so as to lower the cost of the burn-in board. Besides, the high temperature incurred due to high-power electricity can be dispersed to two sides of the burn-in board, and also the high temperature incurred due to transmission of high-power electricity by the burn-in board can be lowered. Moreover, suppose intending to increase burn-in power in the future, namely raising the watts of electric power transmission, an external power transmission component, according to the present invention, can be employed without changing design of the burn-in board. Namely, replacing directly the external power transmission component can satisfy the demand of increasing the burn-in power of the burn-in board. Besides, the external power transmission component facilitates an engineer checking the status of use for a positive wire and a negative wire, so as to determine whether or not maintenance or replacement of the external power transmission component is required. Namely, the replacement or maintenance of the external power transmission component is very convenient, and as a result, the cost of labor is greatly reduced.

To achieve the above-mentioned object, the semiconductor component burn-in test module, according to the present invention, comprises a burn-in board and an external power transmission component. The burn-in board includes a plurality of burn-in seats, wherein a plurality of to-be-tested chips are disposed on the burn-in seats. The external power transmission component is arranged at opposite two sides of the burn-in board, where the external power transmission component includes a plurality of conductive members and two terminal seats. The burn-in board is provided with a plurality of wirings corresponding to the external power transmission component. As such, electric power can be conveyed to the plural burn-in seats of the burn-in board, through the plural terminal seats and the plural conductive strips.

Also, to achieve the above-mentioned object, the semiconductor component burn-in test equipment, using a plurality of semiconductor component burn-in test modules, each comprise a plurality of burn-in boards, a plurality of interface boards, a plurality of driver modules, and a plurality of external power transmission components. The burn-in boards each include a plurality of burn-in seats, wherein a plurality of chips are disposed on the plural burn-in seats. The interface boards are each in connection with each of the burn-in boards. The interface boards each include a high-power power supply for providing electric power required for the burn-in boards. The driver modules are each electrically connected with each of the interface boards, such that the driver modules each include a component power board for providing electric power required for the driver modules. The external power transmission components are each electrically connected with each of the interface boards, and are each arranged at opposite two sides of each of the burn-in boards, where the external power transmission components each include a plurality of conductive members and a plurality of terminal seats. The burn-in boards are each provided with a plurality of wirings corresponding to each of the external power transmission components, so as to convey electric power, from the high-power power supply of each of the interface boards to the plural burn-in seats of each of the burn-in boards, through the plural terminal seats and the plural conductive members.

According to the present invention, the semiconductor component burn-in test module further comprises a frame, such that the external power transmission component is arranged on the frame, and that the burn-in board is disposed inside the frame. The frame includes a plurality of lateral supports and of longitudinal supports, which are interconnected, such that the burn-in board is disposed on the plural lateral supports and the plural longitudinal supports.

Further, according to the present invention, the frame includes a plurality of partitioning brackets each being formed with a plurality of slots, such that the plural slots can receive therein a plurality of lateral wires and a plurality of longitudinal wires of the external power transmission component, so as to ensure that the neighboring lateral wires and longitudinal wires can keep away from each other a specific spacing, and to avoid occurrence of inductance impedance.

Still further, according to the present invention, the lateral wires and the longitudinal wires of the external power transmission component are formed with a positive wire and a negative wire, where the positive wire and the negative wire are disposed at two sides of the burn-in board, so as to facilitate maintenance or replacement of the external power transmission component.

According to the present invention, the plural conductive members of the external power transmission component relate to conductive strips or cables.

Further, according to the present invention, the external power transmission component further includes at least one protective shield, wherein the at least one protective shield can be employed to cover the external power transmission component, so as to isolate electromagnetic waves from interfering with electric circuit signals of the burn-in board, let alone working staff can, during performing the tests, be prevented from touching erroneously the lateral wires and the longitudinal wires of the external power transmission component.

Still further, the interface boards of the burn-in test equipment each are provided with a plurality of terminal ports for being electrically connected with the plural terminal seats of each of the external power transmission components.

According to the present invention, the external power transmission component has its each terminal seat, as well as each port of the interface board, provided with a plurality of pogo pin connectors, where the plural pogo pin connectors include male and female pogo pin connectors, such that both can be inserted into each other, so as to be electrically connected with each other, and to prolong the life of use for the terminal seats and the terminal ports. Besides, such design of pogo pin connectors, according to the present invention, will fit better for the transmission of high-watts electric power.

Further, according to the present invention, the component power board and the driver module can provide, respectively, electric source signals and I/O test signals of the plural chips to the burn-in board.

Still further, according to the present invention, each of the burn-in boards and each of the interface boards include, respectively, a card edge connector, for being electrically connected with each other, such that through each of the interface boards, the electric source signals and the I/O test signals of the component power boards and of the driver modules can be transmitted to the burn-in boards.

The abovementioned brief description and the following detailed description are for the purpose of exemplification, and for a further explanation of the claims, and that it is understood that other objects, advantages, and novel features of the present invention will become more apparent from the following description when taken in conjunction with the accompanying drawings.

DETAILED DESCRIPTION OF THE PREFERRED EMBODIMENTS

Figure 1:
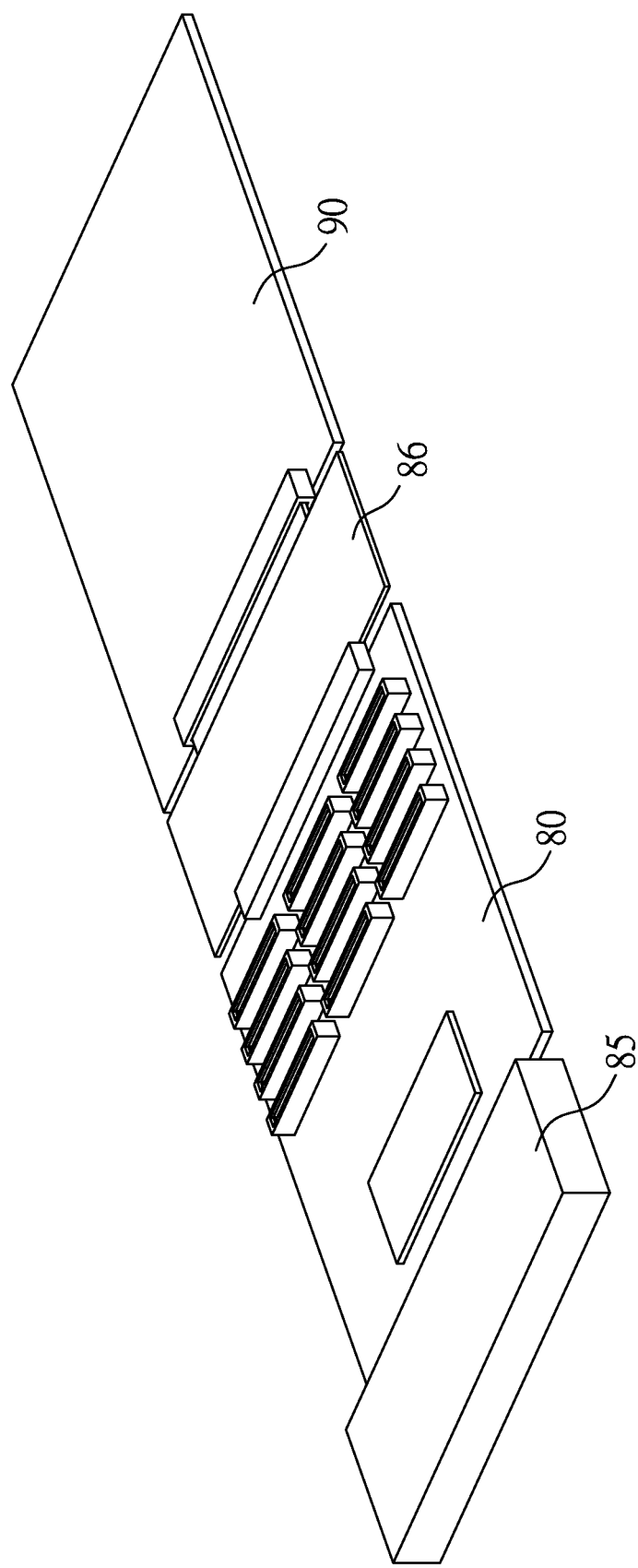
FIG. 1 is a schematic view illustrating a conventional semiconductor component burn-in test equipment.
Figure 2:
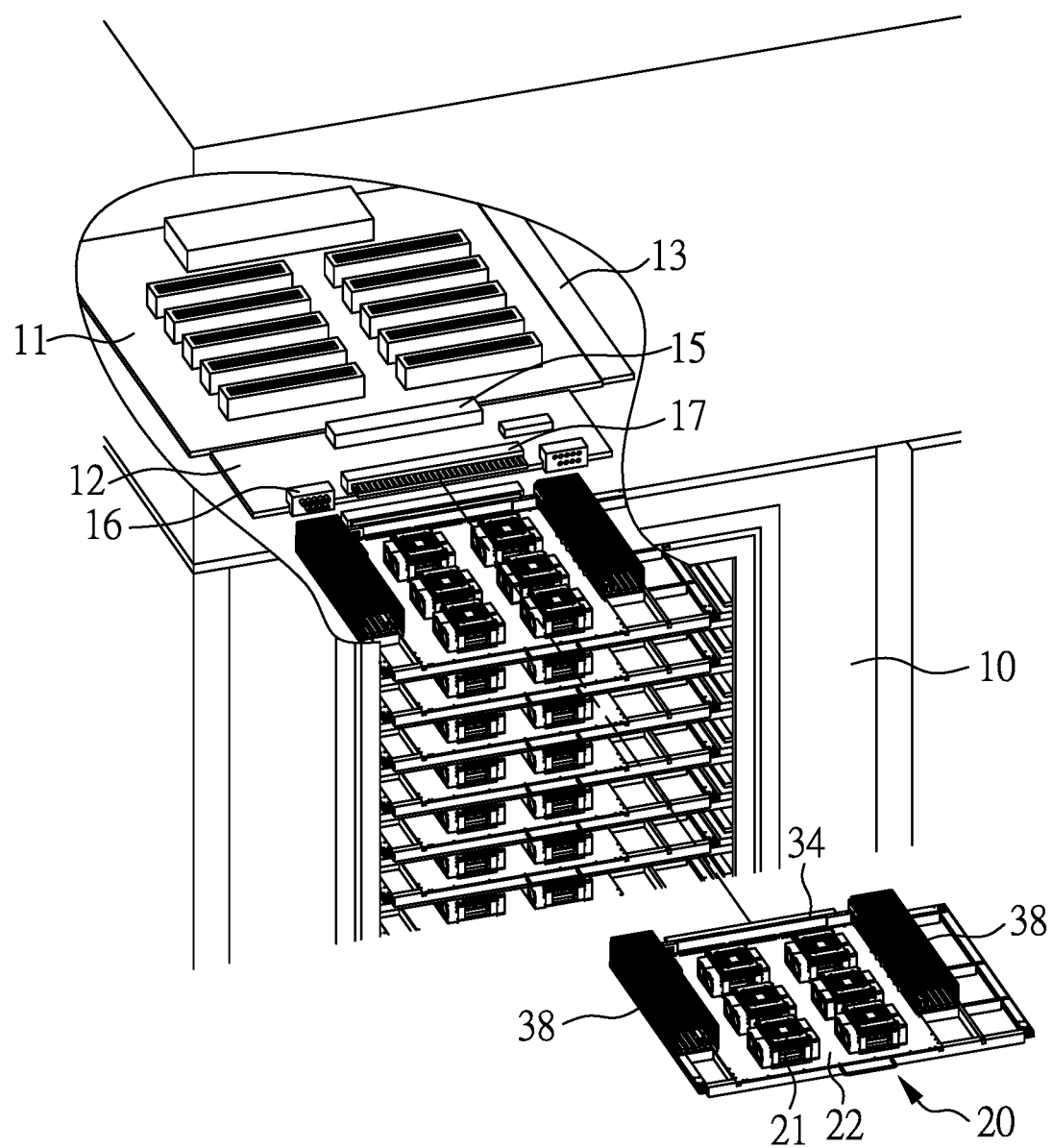
FIG. 2 is a perspective view illustrating a semiconductor component burn-in test equipment according to a first embodiment of the present invention.
Figure 3:
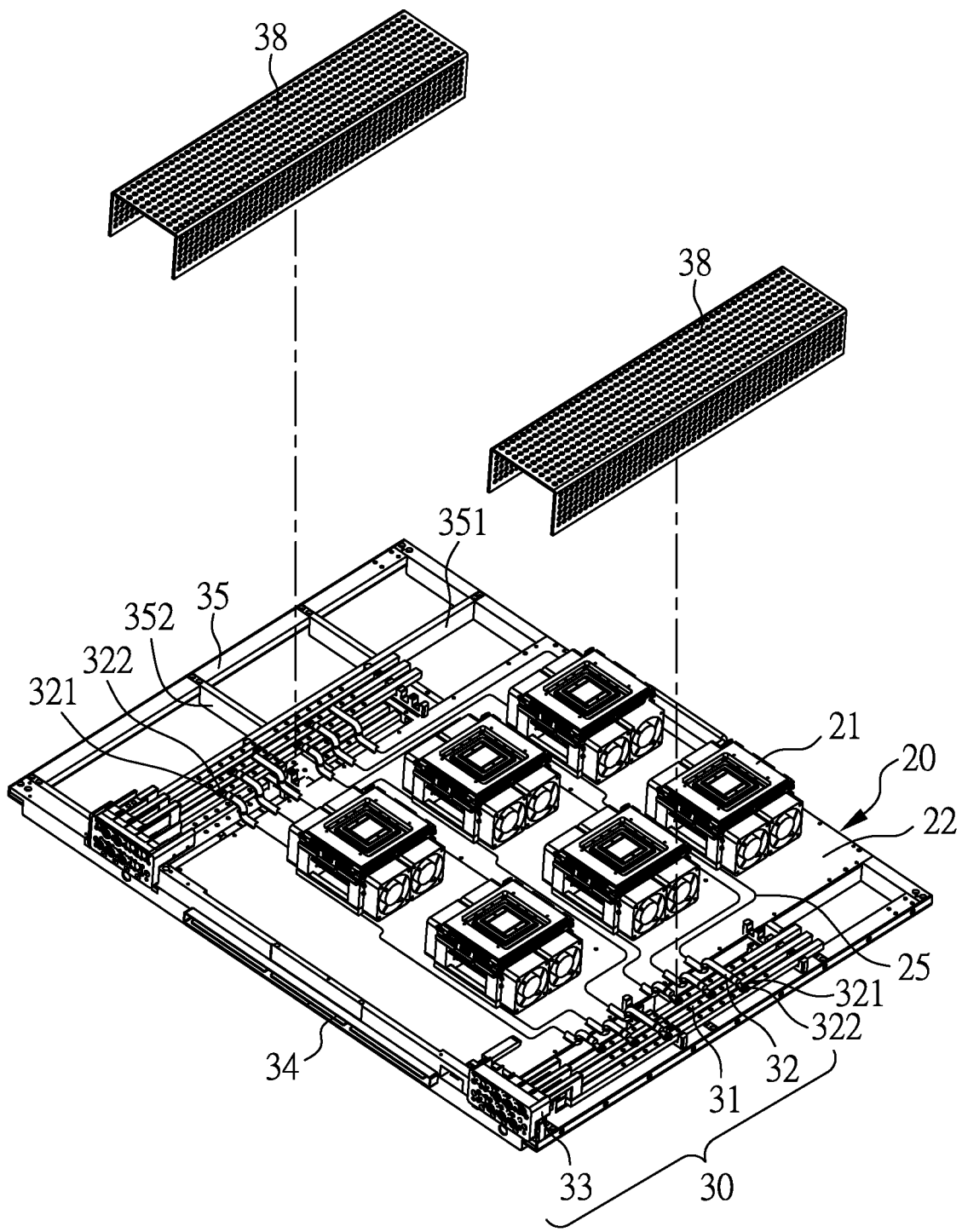
FIG. 3 is a perspective view illustrating a semiconductor component burn-in test module according to the first embodiment of the present invention.

References are made to FIG. 2, a perspective view illustrating a semiconductor component burn-in test equipment according to a first embodiment of the present invention; and FIG. 3, a perspective view illustrating a semiconductor component burn-in test module according to the first embodiment of the present invention. In the first embodiment, the semiconductor component burn-in test equipment 10 can be inserted therein a plurality of burn-in test modules 20, such that burn-in tests can be performed in the same time to semiconductor components through the plural burn-in test modules 20. As shown in FIG. 2, the burn-in test equipment 10 is provided with a plurality of interface boards 12, where the interface boards 12 are each provided with at least one high-power power supply 15 and two terminal ports 16, and where each interface board 12 can be electrically connected with each burn-in test module 20 for performing the test.

First, a description will be made to the structure of the semiconductor component burn-in test module 20. As shown in FIG. 3, the burn-in test module 20 comprises a burn-in board 22, two protective shields 38, and an external power transmission component 30. The burn-in board 22 includes a plurality of burn-in seats 21, wherein a plurality of chips are disposed on the plural burn-in seats 21. The external power transmission component 30 is arranged at opposite two sides of the burn-in board 22, where the external power transmission component 30 includes a plurality of conductive members and two terminal seats 33. In the first embodiment, the conductive members refer to a plurality of conductive strips 31 and a plurality of cables 32.

Further, in the first embodiment, the burn-in board 22 is provided with a plurality of wirings 25 corresponding to the conductive members of the external power transmission component 30. As such, the external power transmission component 30 can convey electric power, from the at least one high-power power supply 15 disposed on the interface board 12 of the burn-in test equipment 10 to the plural burn-in seats 21 of the burn-in board 22, respectively, through the terminal seats 33, the plural conductive strips 31, and the plural cables 32, so as to provide electric power required for high ampere current, for fans, and for heaters, used in the burn-in tests. On the other hand, the electric circuit structure of electric connection, between a card edge connector 17 of the interface board 12 and a card edge connector 34 of the burn-in board 22, can only be used for transmission of electric circuit signals between a driver module 11 and a burn-in board 22 of the burn-in test equipment 10, rather than providing the electric power required for burn-in of the burn-in board 22. In the first embodiment, each burn-in board 22 is provided with six burn-in seats 21.

Still further, in the first embodiment, the external power transmission component 30 is arranged on a frame 35, where the frame 35 includes a plurality of lateral supports 351 and of longitudinal supports 352, which are interconnected, such that the burn-in board 22 is disposed on the plural lateral supports 351 and the plural longitudinal supports 352. Besides, as referring to FIG. 4, a perspective view illustrating one side of the external power transmission component 30 of the semiconductor component burn-in test module 20 according to the first embodiment of the present invention, the frame 35 includes a plurality of partitioning brackets 36 each being formed with a plurality of slots 361, such that the slots 361 can receive therein the conductive strips 31, so as to ensure that the neighboring conductive strips 31 can keep away from each other a specific spacing, and to avoid occurrence of inductance impedance.

Figure 4:
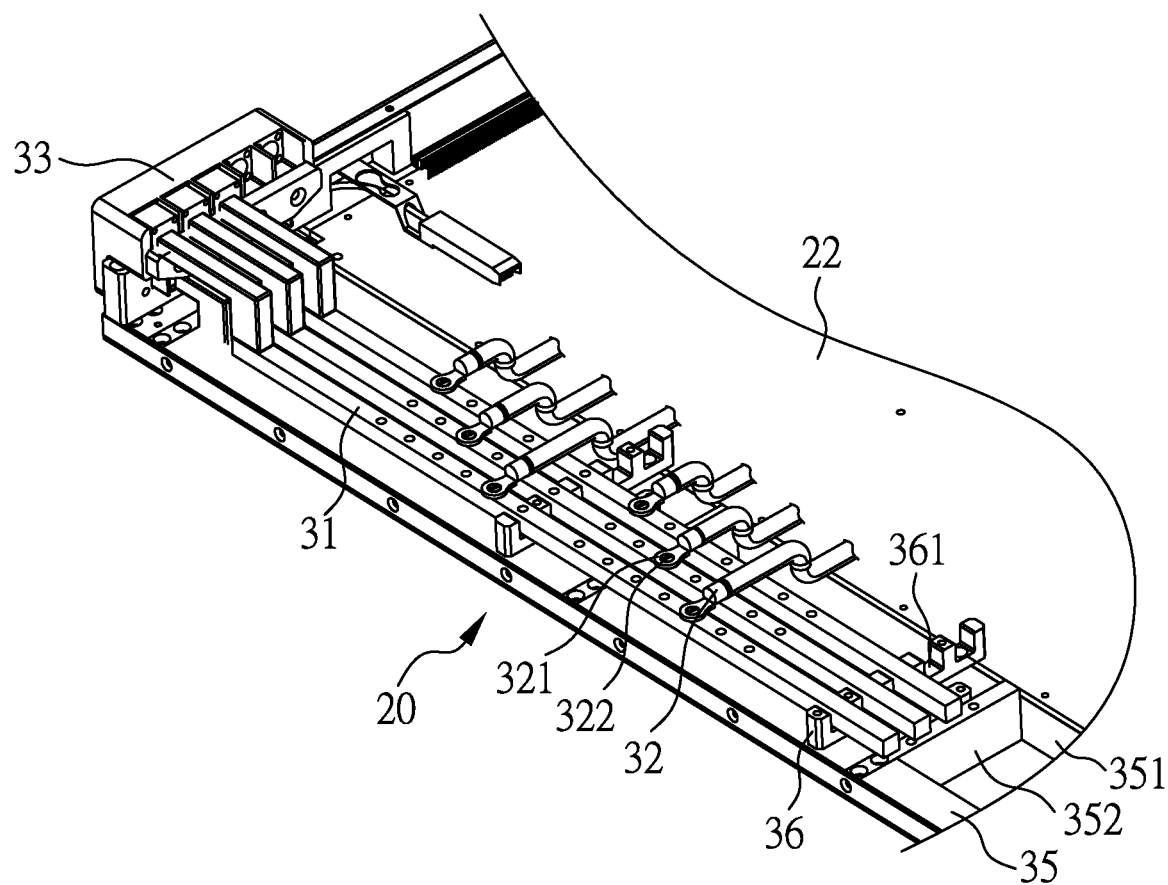
FIG. 4 is a perspective view illustrating one side of an external power transmission component of the semiconductor component burn-in test module according to the first embodiment of the present invention.
Figure 5:
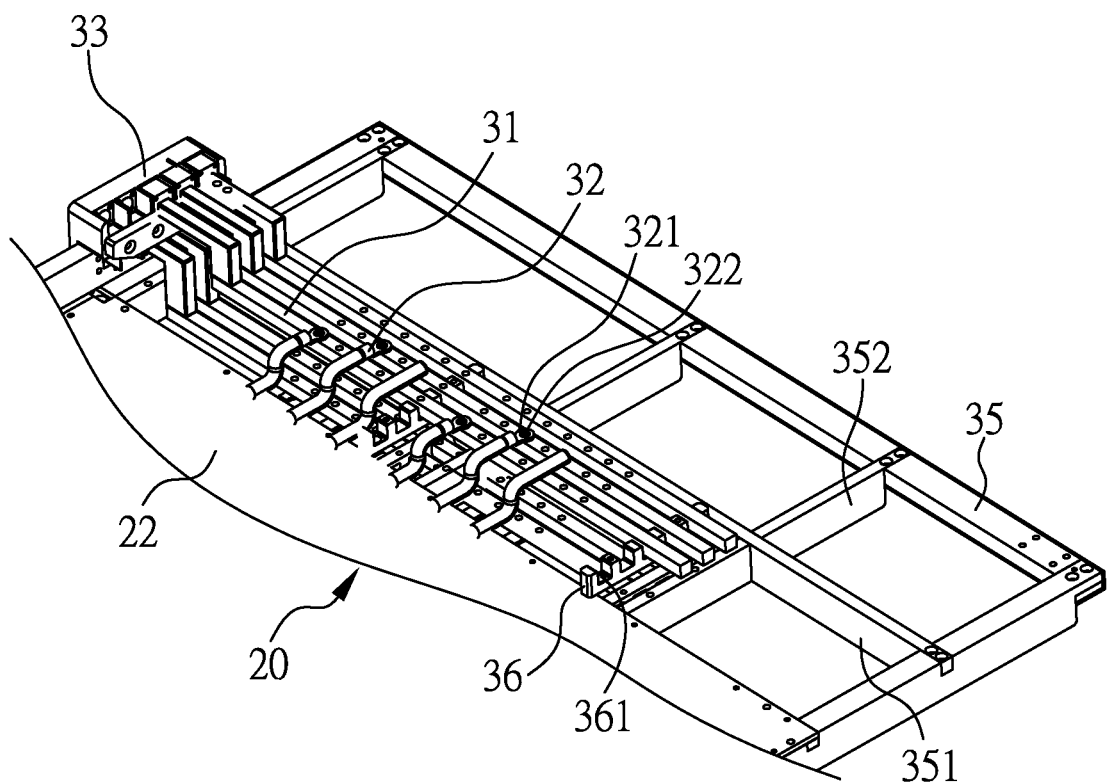
FIG. 5 is a perspective view illustrating another side of the external power transmission component of the semiconductor component burn-in test module according to the first embodiment of the present invention.

Now references are made to FIG. 5, a perspective view illustrating another side of the external power transmission component 30 of the semiconductor component burn-in test module 20 according to the first embodiment of the present invention; and FIG. 4. The plural conductive strips 31 and cables 32 are formed as a positive wire and a negative wire; and that the plural wirings 25 disposed on the burn-in board 22 are formed as a positive wiring and a negative wiring, where the positive wire and the negative wire are disposed at two sides of the burn-in board 22. Namely, arrangement of a positive electrode and a negative electrode is formed at two sides of the burn-in board 22, respectively. This will be able to reduce the length for the wirings 25 of electric source inside the burn-in board 22, and to lower the temperature incurred due to transmission of high-power electricity for the burn-in board 22. In the first embodiment, the external power transmission component 30 has its two sides each covered with a protective shield 38, so as to isolate electromagnetic waves from interfering with electric circuit signals of the burn-in test module 20, let alone working staff can, during performing the tests, be prevented from touching erroneously the conductive strips 31 and the cables 32 of the external power transmission component 30. The cables 32 each have their two ends provided with a bonding head 321 and a screw 322, such that the cables 32 can be fastened firmly in between the conductive strips 31 and the burn-in board 22, so as to facilitate maintenance or replacement of the burn-in board 22.

Figure 6A:
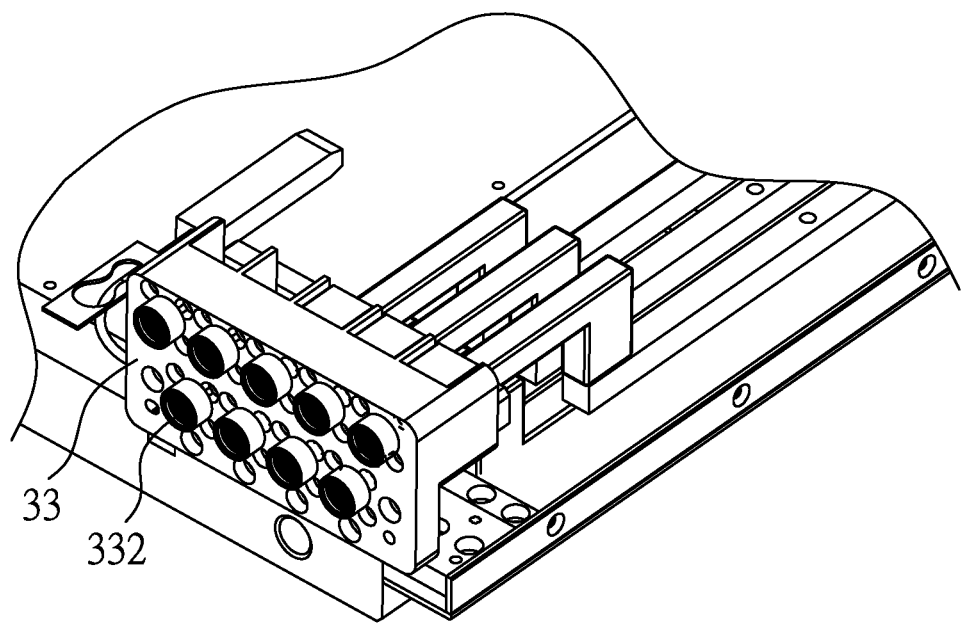
FIG. 6A is a perspective view illustrating a female terminal of the external power transmission component according to the first embodiment of the present invention.
Figure 6B:
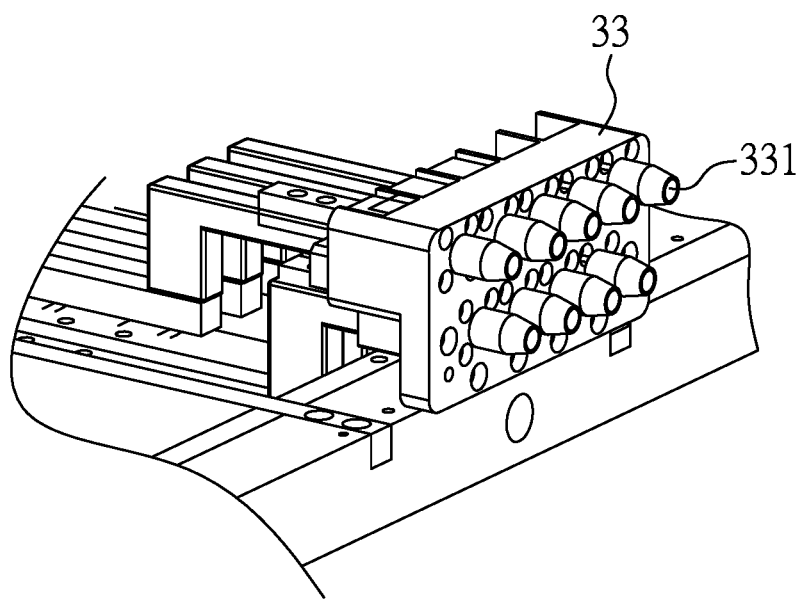
FIG. 6B is a perspective view illustrating a male terminal of the external power transmission component according to the first embodiment of the present invention.

Further references are made to FIG. 6A, a perspective view illustrating a female terminal of the external power transmission component according to the first embodiment of the present invention; and FIG. 6B, is a perspective view illustrating a male terminal of the external power transmission component 30. As shown in FIG. 6A, the external power transmission component 30 has its terminal seats 33 each provided with a plurality of female pogo pin connectors 332. As shown in FIG. 6B, the external power transmission component 30 has its terminal seats 33 each provided with a plurality of male pogo pin connectors 331. The interface boards 12 of the burn-in test equipment 10 each have their two ends inserted with the terminal ports 16 corresponding to the plural female pogo pin connectors 332 and the plural male pogo pin connectors 331. As such, the two terminal ports 16 of the interface board 12 of the burn-in test equipment can be electrically connected with the two terminal seats 33 of the external power transmission component 30 of the burn-in test module 20. In the first embodiment, the terminal seats 33 each adopt the pogo pin connectors 331, 332 so as to prolong the life of use for the terminal seats 33 and the terminal ports 16.

Now referring back to FIG. 2 and FIG. 3, in the first embodiment, the semiconductor component burn-in test equipment 10 comprises a plurality of burn-in board 22, a plurality of interface boards 12, a plurality of driver modules 11, and a plurality of external power transmission components 30. The burn-in boards 22 each include six burn-in seats 21, wherein a plurality of chips are disposed on the six burn-in seats 21. The interface boards 12 each correspondingly and electrically connected with each of the burn-in boards 22, wherein the interface boards 12 each include a high-power power supply 15 for providing electric power required for the burn-in boards 22. The driver modules 11 are each electrically connected with each of the interface boards 12, such that the driver modules 11 each include a component power board 13 for providing electric power required for the driver modules 11.

In the first embodiment, the external power transmission components 30 are each electrically connected with each of the interface boards 12. The external power transmission components 30 are each arranged at opposite sides of each of the burn-in boards 22, where the external power transmission components 30 each include a plurality of conductive strips 31, a plurality of cables 32, and two terminal seats 33. The burn-in boards 22 are each provided with a plurality of wirings 25 correspondingly and electrically connected with the external power transmission component 30, so as to convey electric power, from the high-power power supply 15, disposed on the interface board 12, to each of the plural burn-in seats 21 of each burn-in board 22, through the plural terminal seats 33, the plural conductive strips 31, and the plural cables 32.

Further, in the first embodiment, the burn-in test equipment 10 has its each component power board 13 and each driver module 11 provide electric source signals and I/O test signals of the plural chips, disposed on each burn-in board 22, to the burn-in board 22. In the first embodiment, each burn-in board 22 includes a female card edge connector 34, whereas each interface board 12 includes a male card edge connector 17. The burn-in board 22 and the interface board 12 can be electrically connected with each other. The electric source signals and the I/O test signals of the component power boards 13 and the driver modules 11 of the burn-in test equipment 10 are transmitted to the burn-in boards 22 through the interface boards 12.

Still further, in the first embodiment, through the card edge connector 17 of each interface board 12 and the card edge connector 34 of each burn-in board 22, the electric source signals and the I/O test signals of the burn-in test equipment 10 can be transmitted to the burn-in boards 22. Besides, the two terminal ports 16 of each interface board 12 of the burn-in test equipment 10 are electrically connected with the two terminal seats 33 of the external power transmission component 30 of the burn-in test module 20, so as to provide electric power required for high ampere current, for fans, and for heaters, used in the burn-in tests, for the purpose of burn-in tests for the burn-in boards 22. The power for transmitting the electric source signals and the I/O test signals has a route of transmission different from that of the power for the burn-in tests.

In the first embodiment, the semiconductor component burn-in test modules 20 and burn-in test equipment 10 decreases the length and the number of copper foil wirings in the burn-in boards 22 for power transmission, so as to lower the cost of the burn-in boards 22. Besides, the high temperature incurred due to high-power electricity can be dispersed to two sides of the burn-in boards 22, and also the high temperature incurred due to transmission of high-power electricity by the burn-in boards 22 can be lowered. Moreover, suppose intending to increase burn-in power in the future, namely raising the watts of electric power transmission, the external power transmission components 30 can be employed without changing design of the burn-in boards 22.

Namely, replacing directly the external power transmission components 30 can satisfy the demand of increasing the burn-in power of the burn-in boards 22. Besides, the external power transmission components 30 facilitate engineers checking the status of use for positive wires and negative wires, so as to determine whether or not maintenance or replacement of the external power transmission components 30 is required. Namely, the replacement or maintenance of the external power transmission components 30 is very convenient, and as a result, the cost of labor is greatly reduced.

Figure 7:
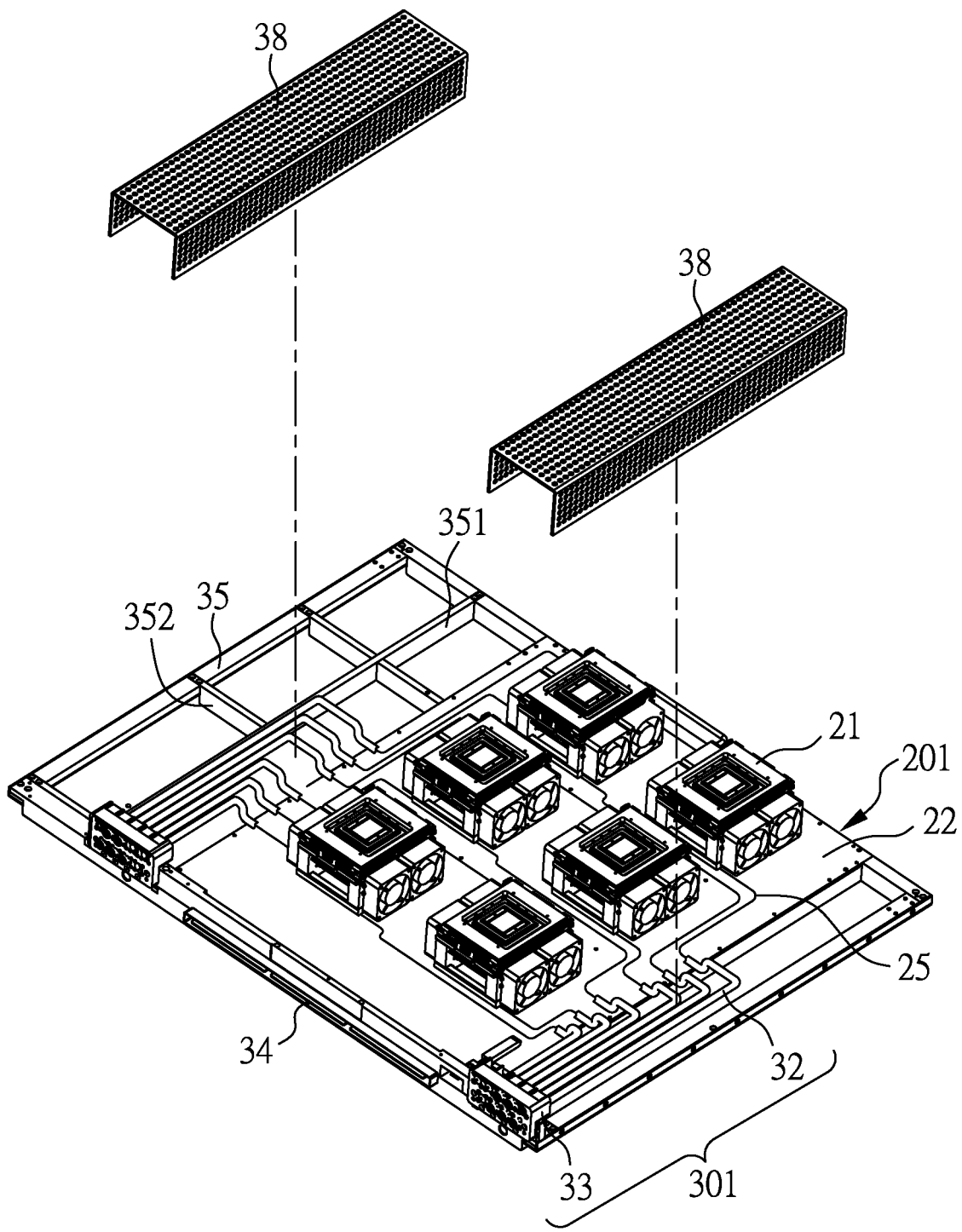
FIG. 7 is a perspective view illustrating a semiconductor component burn-in test module according to a second embodiment of the present invention.

Further, a reference is made to FIG. 7, a perspective view illustrating a semiconductor component burn-in test module according to a second embodiment of the present invention. In the second embodiment, a semiconductor component burn-in test module 201 has a structure substantially similar to that of the semiconductor component burn-in test module 20 in the first embodiment, except that in the second embodiment, an external power transmission component 301 of the burn-in test module 201 includes a plurality of conductive members which all relate to cables 32; whereas in the first embodiment, the external power transmission component 30 of the burn-in test module 20 includes a plurality of conductive members which relate to the cables 32 and the conductive strips 31.

Figure 8:
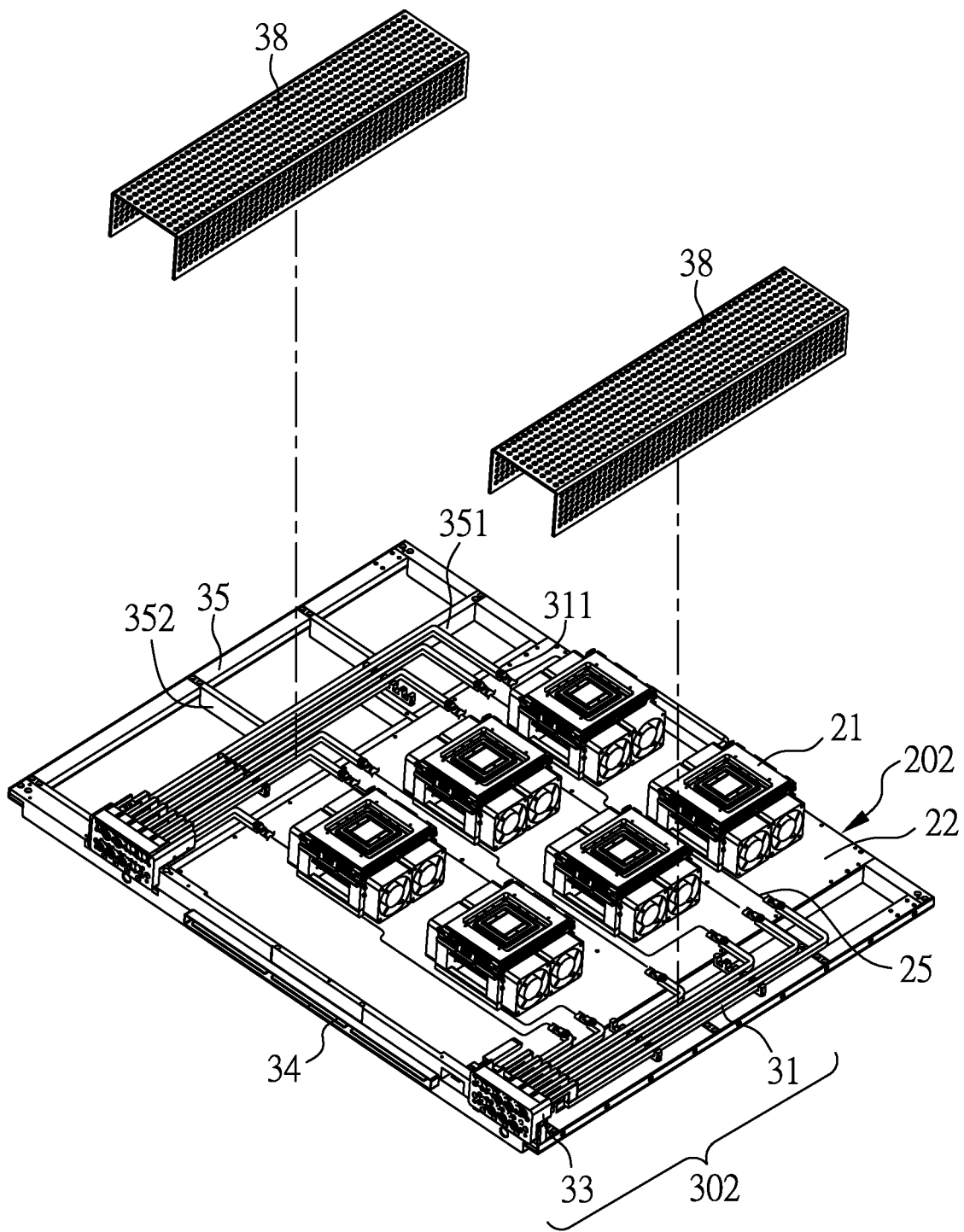
FIG. 8 is a perspective view illustrating a semiconductor component burn-in test module according to a third embodiment of the present invention.

Still further, a reference is made to FIG. 8, a perspective view illustrating a semiconductor component burn-in test module according to a third embodiment of the present invention. In the third embodiment, a semiconductor component burn-in test module 202 has a structure substantially similar to that of the semiconductor component burn-in test module 20 in the first embodiment, except that in the third embodiment, an external power transmission component 302 of the burn-in test module 202 includes a plurality of conductive members which all relate to conductive strips 31; whereas in the first embodiment, the external power transmission component 30 of the burn-in test module 20 includes a plurality of conductive members which relate to the cables 32 and the conductive strips 31. Besides, in the third embodiment, the conductive strips 31 each have its one end connected with the burn-in board 22, such that screws 311 are provided to pass through the burn-in board 22, so as to fasten firmly the conductive strips 31 on the burn-in board 22. This not only facilitates maintenance or replacement of the burn-in boards 22, but also makes the conductive strips 31 tightly connect with wirings 25 of the burn-in boards 22, so as to prevent joints between the conductive strips 31 and the burn-in boards 22 from incurring high temperature due to excessive impedance, or even from burning down of the burn-in boards 22.

Figure 9:
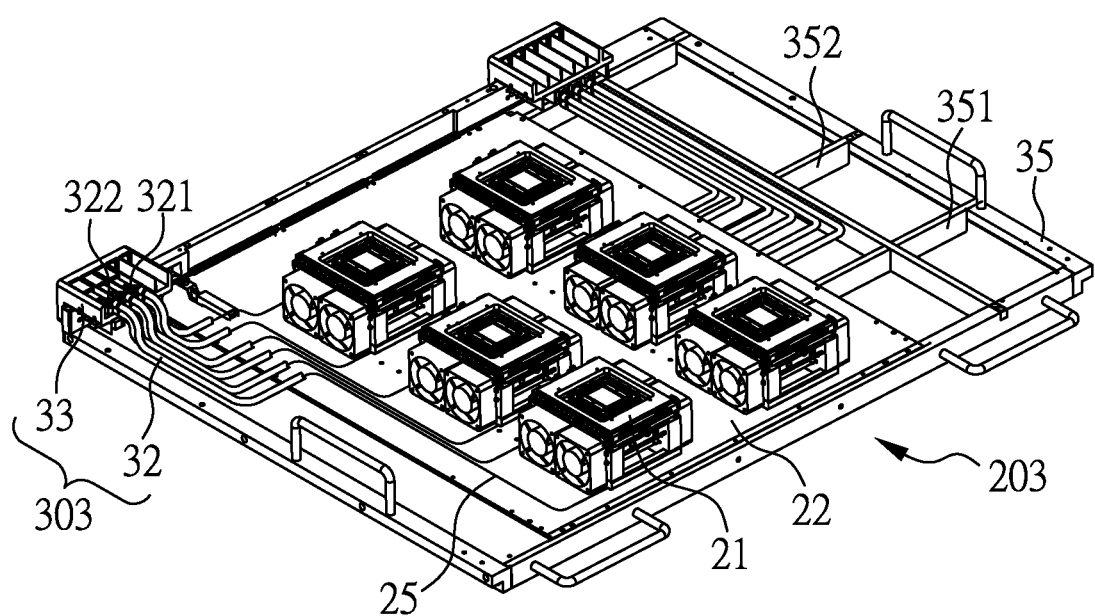
FIG. 9 is a perspective view illustrating a semiconductor component burn-in test module according to a fourth embodiment of the present invention.

Now a reference is made to FIG. 9, a perspective view illustrating a semiconductor component burn-in test module according to a fourth embodiment of the present invention. In the fourth embodiment, a semiconductor component burn-in test module 203 has a structure substantially similar to that of the semiconductor component burn-in test module 201 in the second embodiment, except that in the fourth embodiment, an external power transmission component 303 of the burn-in test module 203 includes positive wires and negative wires disposed at two sides of the burn-in boards 22, respectively at upsides and downsides; whereas in the second embodiment, the external power transmission component 301 of the burn-in test module 201 includes positive wires and negative wires disposed at two sides of the burn-in boards 22, only at upsides.

According to the present invention, in the second embodiment, the third embodiment, and the fourth embodiment, the burn-in test modules 201, 202, 203 have the same effectiveness as that of the burn-in test module 20 in the first embodiment. Namely, the length and the number of copper foil wirings in the burn-in boards 22 for power transmission can be decreased, so as to lower the cost of the burn-in boards 22. Besides, the high temperature incurred due to high-power electricity can be dispersed to two sides of the burn-in boards 22, and also the high temperature incurred due to transmission of high-power electricity by the burn-in boards 22 can be lowered. Moreover, suppose intending to increase burn-in power in the future, namely raising the watts of electric power transmission, the external power transmission components 30 can be employed without changing design of the burn-in boards 22. Namely, replacing directly the external power transmission components 30 can satisfy the demand of increasing the burn-in power of the burn-in boards 22. Besides, the external power transmission components 30 facilitate engineers checking the status of use for positive wires and negative wires, so as to determine whether or not maintenance or replacement of the external power transmission components 30 is required. Namely, the replacement or maintenance of the external power transmission components 30 is very convenient, and as a result, the cost of labor is greatly reduced.

Although the present invention has been explained in relation to its preferred embodiments, it is to be understood that many other possible modifications and variations can be made without departing from the scope of the invention as hereinafter claimed.

What is claimed is:

1. A semiconductor component burn-in test module, comprising:
    a burn-in board, including a plurality of burn-in seats, wherein a plurality of chips are disposed on the burn-in seats;
    an external power transmission component, arranged at opposite two sides of the burn-in board, wherein the external power transmission component includes a plurality of conductive members and a plurality of terminal seats, and wherein the burn-in board is provided with a plurality of wirings corresponding to the external power transmission component, such that electric power can be conveyed to the plural burn-in seats of the burn-in board, through the plural terminal seats and the plural conductive members; and
    a frame, wherein the external power transmission component is arranged on the frame, and the burn-in board is disposed inside the frame, wherein the frame includes a plurality of lateral supports and of longitudinal supports, which are interconnected, and wherein the burn-in board is disposed on the plural lateral supports and the plural longitudinal supports, wherein the frame includes a plurality of partitioning brackets each being formed with a plurality of slots, and the plural slots can receive therein at least one of the plural conductive members.

2. The semiconductor component burn-in test module as claimed in claim 1, wherein the external power transmission component is formed with a positive wire and a negative wire, and the positive wire and the negative wire are disposed at two sides of the burn-in board.

3. The semiconductor component burn-in test module as claimed in claim 1, wherein the plural conductive members of the external power transmission component relate to conductive strips or cables.

4. The semiconductor component burn-in test module as claimed in claim 1, further comprising a protective shield for covering the external power transmission component, so as to isolate electromagnetic waves from interfering therewith.

5. The semiconductor component burn-in test module as claimed in claim 1, wherein the external power transmission component has its each terminal seat provided with a plurality of pogo pin connectors.

6. A semiconductor component burn-in test equipment, comprising:
    a plurality of burn-in boards, each including a plurality of burn-in seats, wherein a plurality of chips are disposed on the plural burn-in seats;
    a plurality of interface boards, each being in connection with each of the burn-in boards, wherein the interface boards each include a high-power power supply for providing electric power required for the burn-in boards;
    a plurality of driver modules, each being electrically connected with each of the interface boards, wherein the driver modules each include a component power board for providing electric power required for the driver modules;
    a plurality of external power transmission components, each being electrically connected with each of the interface boards, and each being arranged at opposite two sides of each of the burn-in boards, wherein the external power transmission components each include a plurality of conductive members and a plurality of terminal seats, and wherein the burn-in boards are each provided with a plurality of wirings corresponding to each of the external power transmission components, so as to convey electric power, from the high-power power supply of each of the interface boards to the plural burn-in seats of each of the burn-in boards, through the plural terminal seats and the plural conductive members; and
    a plurality of frames, wherein the external power transmission components area each arranged on each of the frames, and the burn-in boards are each disposed inside each of the frames, wherein the frames each include a plurality of lateral supports and of longitudinal supports, which are interconnected, and wherein the burn-in boards are each disposed on the plural lateral supports and the plural longitudinal supports, wherein the frames each include a plurality of partitioning brackets each being formed with a plurality of slots, and the plural slots can receive therein at least one of the plural conductive members.

7. The semiconductor component burn-in test equipment as claimed in claim 6, wherein the external power transmission components are each formed with a positive wire and a negative wire, and the positive wire and the negative wire are disposed at two sides of each of the burn-in boards.

8. The semiconductor component burn-in test equipment as claimed in claim 6, wherein the plural conductive members of each of the external power transmission components relate to conductive strips or cables.

9. The semiconductor component burn-in test equipment as claimed in claim 6, further comprising a plurality of protective shields for covering the plural external power transmission components, so as to isolate electromagnetic waves from interfering therewith.

10. The semiconductor component burn-in test equipment as claimed in claim 6, wherein the interface boards of the burn-in test equipment each are provided with a plurality of terminal ports for being electrically connected with the plural terminal seats of each of the external power transmission components.

11. The semiconductor component burn-in test equipment as claimed in claim 6, wherein the plural terminal seats, as well as the plural interface boards, relate to plural pogo pin connectors, for prolonging the life of use for the terminal seats and for the terminal ports.

12. The semiconductor component burn-in test equipment as claimed in claim 6, wherein each of the component power boards and each of the driver modules can provide, respectively, electric source signals and I/O test signals of the plural chips to each of the burn-in boards.

13. The semiconductor component burn-in test equipment as claimed in claim 6, wherein each of the burn-in boards and each of the interface boards include, respectively, a card edge connector, for being electrically connected with each other, such that through each of the interface boards, the electric source signals and the I/O test signals of each of the component power boards and of each of the driver modules can be transmitted to each of the burn-in boards.

\* \* \* \* \*